United States Patent [19]

Higashi et al.

[11] 4,271,398

[45] Jun. 2, 1981

[54] TONE CONTROL DEVICE

[75] Inventors: Ryozi Higashi; Hiroyuki Hirano, both of Saitama, Japan

[73] Assignee: Pioneer Electronic Corporation, Tokyo, Japan

[21] Appl. No.: 98,090

[22] Filed: Nov. 28, 1979

[30] Foreign Application Priority Data

Nov. 30, 1978 [JP] Japan ............................. 53 147222
Dec. 8, 1978 [JP] Japan ............................. 53-150956

[51] Int. Cl.³ ..................... H03H 7/03; H03H 11/06; H04B 3/04
[52] U.S. Cl. ................................. 333/28 T; 330/84; 330/85; 330/126
[58] Field of Search ..................... 333/18, 28 R, 28 T; 330/84, 85, 126; 179/1 D

[56] References Cited

U.S. PATENT DOCUMENTS

| | | | |
|---|---|---|---|
| 3,624,539 | 11/1971 | Kao et al. | 330/126 X |
| 3,771,071 | 11/1973 | Delfrate | 333/28 R |
| 3,921,104 | 11/1975 | Gundry | 333/28 T X |

*Primary Examiner*—Paul L. Gensler
*Attorney, Agent, or Firm*—Sughrue, Rothwell, Mion, Zinn and Macpeak

[57] ABSTRACT

A tone control circuit device including a plurality of bandpass filters connected in parallel with one another with each of the bandpass filters having a different center frequency and each being variable in order to vary the tone as in a graphic equalizer. In one embodiment, the output signals from the bandpass filters are coupled both to non-inverting input terminals of output and input signal summers. The input signal is coupled to another input of the input signal summer and the combined signals coupled to inputs of each of the bandpass filters and to a non-inverting terminal of the output signal summer. In another embodiment, plural characteristic circuits, each including a band-stop filter, are connected in parallel between input and output signal summers through a disclosed amplifier network. With this invention, a graphic equalizer tone control device can be constructed which is essentially free from noise and which has a very low distortion factor.

4 Claims, 7 Drawing Figures

TONE CONTROL DEVICE

BACKGROUND OF THE INVENTION

The invention relates to an improvement of a tone control device such as a graphic equalizer.

In a conventional tone control device, as shown in FIG. 1, the outputs of bandpass filters $1_1$ through $1_n$ having corresponding transfer functions $B_n(s)$ are applied to the input and output amplifiers 3 and 4 through variable resistors $2_1$ through $2_n$, respectively, which have grounded center taps so that the gains at a plurality of particular frequencies are boosted or cut. This conventional tone control device is disadvantageous in that the quality of signals is lowered as the gain is varied due to the non-parallel arrangement of the filters.

In another prior art arrangement, a tone control device was obtained by forming a circuit which had the following transfer function $T(s)$:

$$T(s) = \frac{s^2 + \frac{\omega_0}{Q} sK_2 + \omega_0^2}{s^2 + \frac{\omega_0}{Q} sK_1 + \omega_0^2}, \quad (1)$$

where s is the Laplace operator, $\omega_0$ is the center angular frequency, Q is the sharpness, $k_1$ is the attenuation factor at the angular frequency $\omega_0$, and $k_2$ is the amplification factor at the angular frequency $\omega_0$. With this transfer function, if the values $k_1$ and $k_2$ are varied with the values $\omega_0$ and Q held constant, then a flat frequency characteristic can be obtained with $k_1 = k_2 = 1$, a boosted frequency characteristic with $k_1 = 1$ and $k_2 > 1$, and a cut frequency characteristic with $k_1 > 1$ and $k_2 = 1$, all as shown in FIG. 4.

A prior art circuit arrangement which was intended to cover the audio frequency band by combining circuits having transfer functions $T_1(s)$ through $T_n(s)$ having different center frequencies is shown in FIG. 5. However, this arrangement suffers from noise problems and an increased distortion factor.

Accordingly, an object of this invention is to provide a tone control device in which the bandpass filters are connected in parallel with one another and the frequency characteristics of the device can be varied without lowering the quality of signals.

An object of this invention is also to provide a tone control device in which band-stop filters are connected in parallel and tone control in plural channels is effected while the device is free from noise and has a low distortion factor.

SUMMARY OF THE INVENTION

These, as well as other objects of the invention, are met in accordance with the invention by a tone control device having a plurality of bandpass filters each of which has a different center frequency and each of which has valuable characteristics to provide for tone control, a signal sum circuit for summing output signals of the bandpass filters and an input signal, an output signal from the sum circuit being coupled to inputs of the bandpass filter, and a signal sum and different circuit, outputs of the bandpass filters being coupled to inverting input terminals of the sum and different circuit and the output signal from the sum circuit being coupled to a non-inverting input terminal of the sum and different circuit, in output signals from the sum and different circuit forming the output signal of the device.

The output signals of the bandpass filters and the input signal are coupled to inverting input terminals of the sum circuit. Thus, it may be appreciated that the term sum circuit as used herein is a generic expression covering both addition and subtracting circuits.

Yet further in accordance with the objects of the invention, there may be provided a tone control device including characteristic circuits n in number corresponding to n channels which are parallel-connected between input and output signal sum circuits provided on input and output sides of the device. Each of the characteristic circuits includes a first amplifier having an amplification factor of 1/n, a band-stop filter which receives as an input an output of the input sum circuits and with an output connected to an input of the output sum circuit through the first amplifier, a second amplifier having the same amplification factor of 1/n which receives as an input a signal representing a difference between an output of the signal sum circuit on the input side and an output of the band-stop filter with an output signal from the second amplifier being coupled to an input of the output signal sum circuit, a third amplifier which receives as an input the signal representing the difference with an output of the third amplifier being coupled to an input of the output signal summer, and a fourth amplifier which receives as an input the signal representing the difference with an output of the third amplifier being coupled to an input of the input signal summer. The inputs of the input and output sum circuits are, in a preferred embodiment, all inverting inputs.

DESCRIPTION OF THE PREFERRED EMBODIMENTS

A preferred example of a tone control device according to this invention will be described with reference to FIG. 2. In the example shown in FIG. 2, the input terminals of n bandpass filters $1_1$ through $1_n$ are connected to the output terminal of a signal sum circuit 5 while the output terminals of the bandpass filters are connected to inverting input terminals of a sum and difference circuit 6 and to the inverting input terminals of the sum circuit 5. The output terminal of the sum circuit 5 is connected to the non-inverting input terminal of the sum and difference circuit 6.

The transfer function $B_n(s)$ of the bandpass filter $1_1$ is expressed by the following equation (2):

$$B_n(s) = \frac{\frac{\omega_n}{Q} \cdot s \cdot X_n}{s^2 + \frac{\omega_n}{Q} \cdot s + \omega_n^2} \quad (2)$$

where $\omega_n$ is the central angular frequency, $X_n$ is the gain, and s is the complex frequency.

Figure 1:
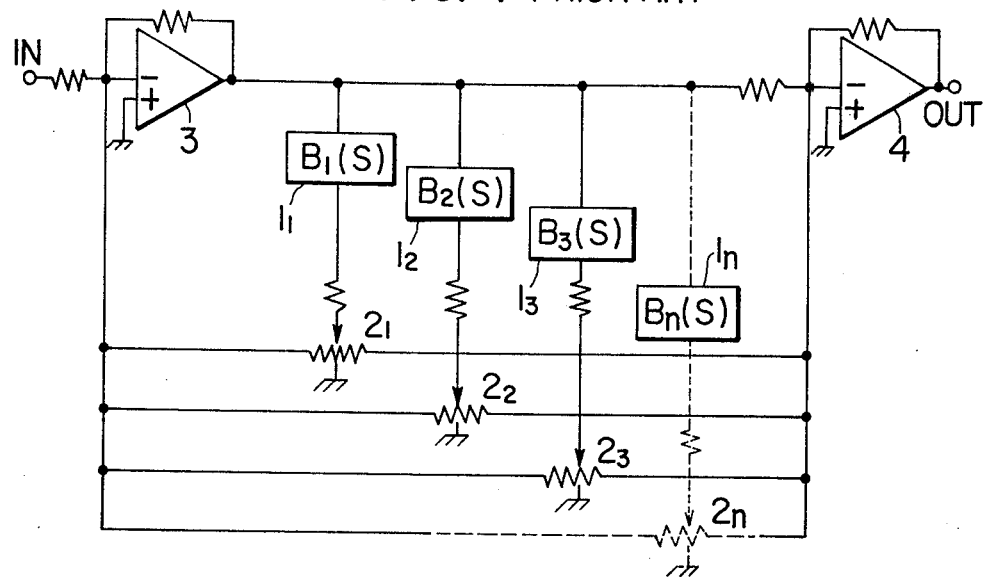
FIG. 1 is a circuit diagram showing a conventional tone control device.
Figure 2:
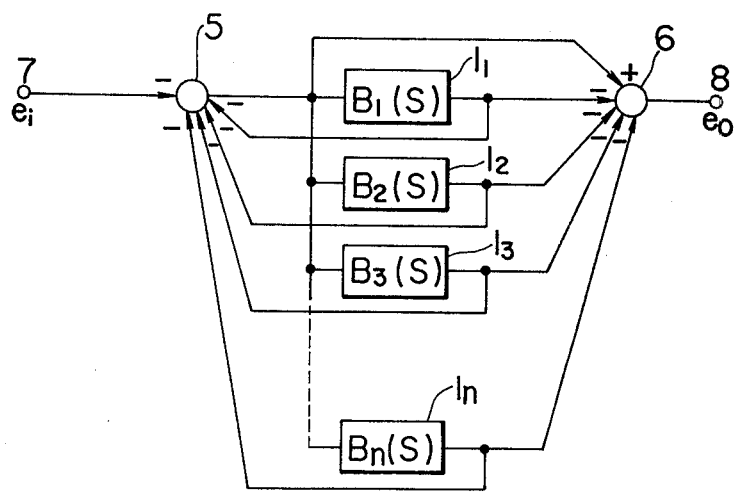
FIG. 2 is a circuit diagram illustrating a preferred example of a tone control device according to the invention.

Accordingly, the transfer function T(s) between the signal input terminal 7 and the signal output terminal 8 in FIG. 2 can be represented by the following equation (3):

$$T(s) = \frac{e_0}{e_1}$$

$$= \frac{1 - \frac{\frac{\omega_1}{Q} \cdot s \cdot X_1}{s^2 + \frac{\omega_1}{Q} \cdot s + \omega_1^2} - \frac{\frac{\omega_2}{Q} \cdot s \cdot X_2}{s^2 + \frac{\omega_2}{Q} \cdot s + \omega_2^2} \cdots - \frac{\frac{\omega_n}{Q} \cdot s \cdot X_n}{s^2 + \frac{\omega_n}{Q} \cdot s + \omega_n^2}}{1 + \frac{\frac{\omega_1}{Q} \cdot s \cdot X_1}{s^2 + \frac{\omega_1}{Q} \cdot s + \omega_1^2} + \frac{\frac{\omega_2}{Q} \cdot s \cdot X_2}{s^2 + \frac{\omega_2}{Q} \cdot s + \omega_2^2} \cdots + \frac{\frac{\omega_n}{Q} \cdot s \cdot X_n}{s^2 + \frac{\omega_n}{Q} \cdot s + \omega_n^2}}$$

$$= \frac{1 - \sum_{n=1}^{n} \frac{\frac{\omega_n}{Q} \cdot s \cdot X_n}{s^2 + \frac{\omega_n}{Q} \cdot s + \omega_n^2}}{1 + \sum_{n=1}^{n} \frac{\frac{\omega_n}{Q} \cdot s \cdot X_n}{s^2 + \frac{\omega_n}{Q} \cdot s + \omega_n^2}}$$

Figure 3:
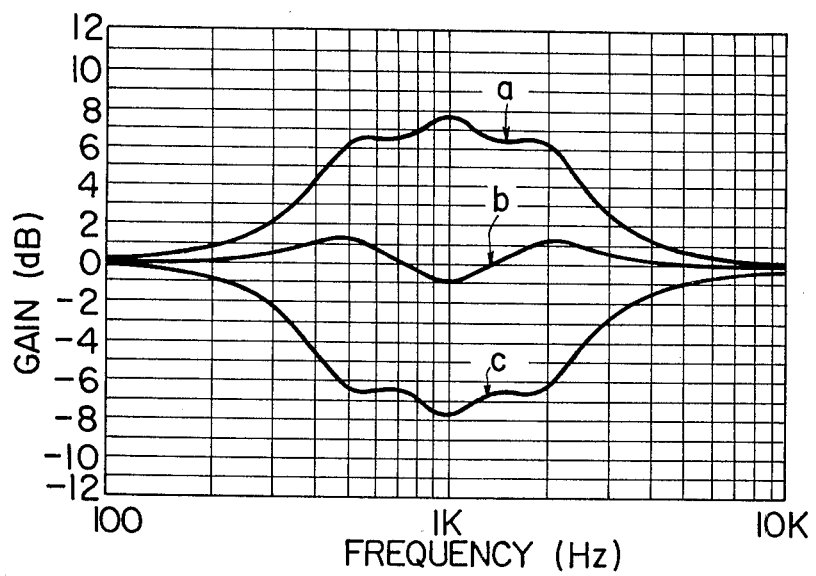
FIG. 3 is a graphic representation indicating the frequency response characteristics of the tone control device shown in FIG. 2.
Figure 4:
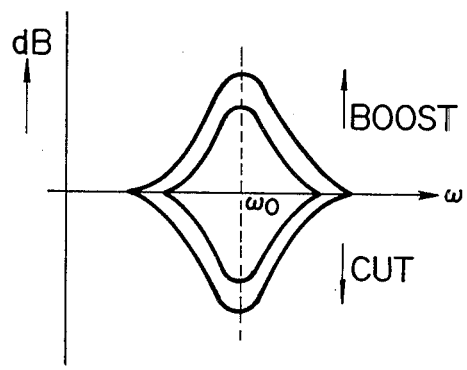
FIG. 4 is a graphical representation indicating frequency characteristics for one channel of a graphic equalizer.
Figure 5:
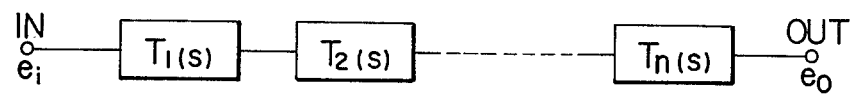
FIG. 5 is a block diagram showing cascade-connected circuits having different transfer functions.

Simulation of the equation (3) according the following Tables 1, 2 and 3 is as indicated in FIG. 3. More specifically, reference character a in FIG. 3 indicates the simulation according to Table 1, reference character b indicates the simulation according to Table 2, and reference character c indicates the simulation according to Table 3.

TABLE 1

| $f_0$ (Hz) | Q | X |
|---|---|---|
| 500 | 3.87 | 0.28 |
| 1000 | 3.87 | 0.28 |
| 2000 | 3.87 | 0.28 |

TABLE 2

| $f_0$ (Hz) | Q | X |
|---|---|---|
| 500 | 3.87 | −0.09 |
| 1000 | 3.87 | 0.09 |
| 2000 | 3.87 | −0.09 |

TABLE 3

| $f_0$ (Hz) | Q | X |
|---|---|---|
| 500 | 3.87 | −0.28 |
| 1000 | 3.87 | −0.28 |
| 2000 | 3.87 | −0.28 |

As is apparent from the above description and FIG. 3, according to the invention, boosting and cutting can be carried out without lowering the quality of the signal. Thus, the tone control device according to the invention can readily be employed as a graphic equalizer or the like.

Figure 6:
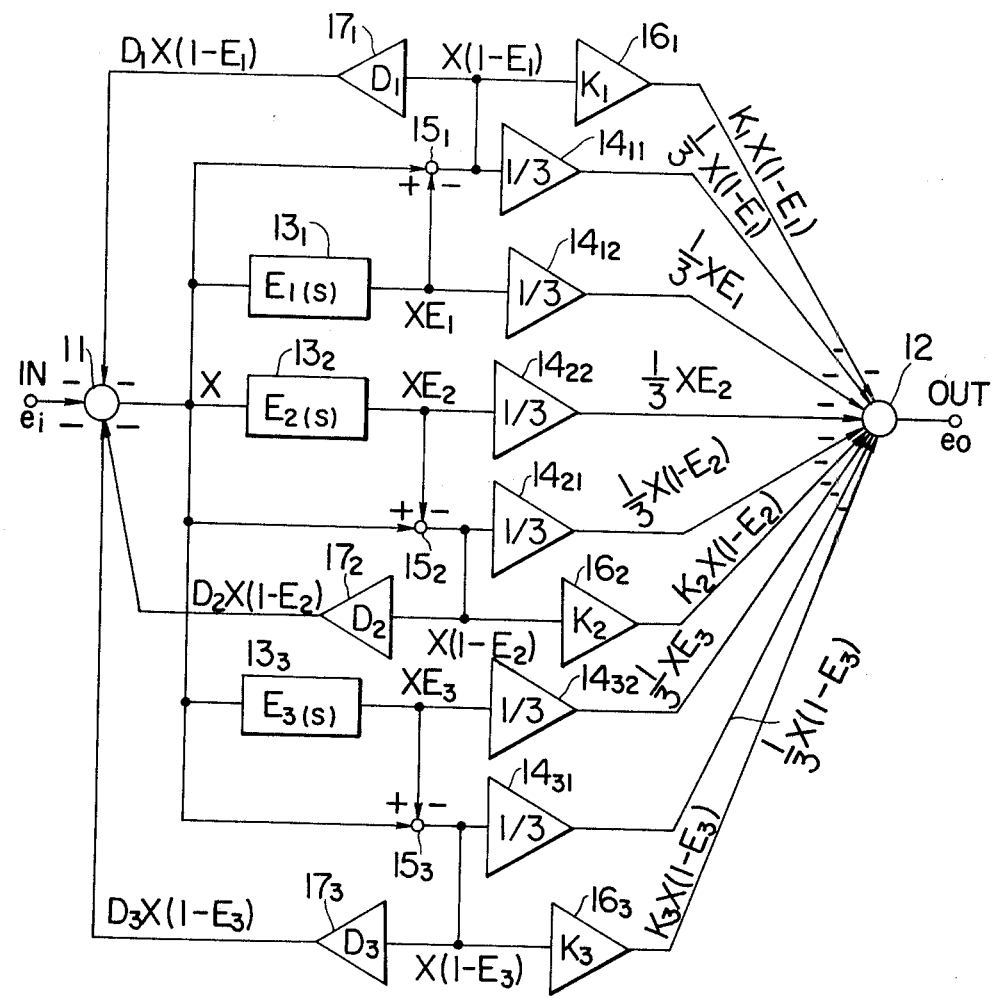
FIG. 6 is a block diagram showing an example of a tone control device according to the invention.

Another example of a tone control device according to the invention will be described with reference to FIG. 6. As shown in FIG. 6, signal sum circuits 11 and 12 each having opposite-phase input terminals are provided at the input and output sides of the device, respectively. Characteristic circuits of three channels are interposed between the sum circuits 11 and 12. With respect to a first channel, a band-stop filter $13_1$ which receives the output of the sum circuit 11 and has a transfer function $E_1(s)$ is connected to an amplifier $14_{12}$ whose amplification factor is ⅓ with the output of the amplifier $14_{12}$ connected to the sum circuit 12. The output of the sum circuit 11 and the output of the band-stop filter $13_1$ are compared and subtracted at the subtraction point $15_1$ with the result applied through an amplifier $14_{11}$ having an amplification factor ⅓ to the sum circuit 12. In addition, the comparison and subtraction result from point $15_1$ is applied through an amplifier $16_1$ having an amplification factor $k_1$ to the sum circuit 12 and through an amplifier $17_1$ having an amplification factor $D_1$ to the sum circuit 11.

In the second and third channels, reference characters $13_2$ and $13_3$ designate band-stop filters having transfer functions $E_2(s)$ and $E_3(s)$, respectively; $14_{21}$, $14_{22}$, $14_{31}$ and $14_{32}$, amplifiers each having an amplification factor ⅓; $15_2$ and $15_3$, comparison and subtraction points; $16_2$ and $16_3$, amplifiers having amplification factors $k_2$ and $k_3$, respectively; and $17_2$ and $17_3$, amplifiers having amplification factors $D_2$ and $D_3$, respectively. These elements are connected in a similar manner as in the first channel.

The transfer function $E_n(s)$ (where n=1 through 3) can be represented by the following equation (4):

$$E_n = \frac{s^2 + \omega_n^2}{s^2 + \frac{\omega_n}{Q_n} + \omega_n^2}, \quad (4)$$

where s is the Laplace operator, $Q_n$ is the sharpness, and $\omega_n$ is the center angular frequency.

The center frequencies and the sharpnesses of the channels are determined by the characteristics of the band-stop filters $13_1$ through $13_3$. In addition, the degrees of boost and cut at the center frequencies of the channels are determined by the amplification factors of the amplifiers $16_1$ through $16_3$ and $17_1$ through $17_3$.

Assuming a status variable x is applied to the output of the sum circuit 11, then signals at various points are as illustrated. Accordingly, the following equation (5) is established:

$$x = -e_i - D_1 \times (1 - E_1) - D_2 \times (1 - E_2) - D_3 \times (1 - E_3) \quad (5)$$

-continued
$$e_0 = -k_1 \times (1 - E_1) - \tfrac{1}{3} \times (1 - E_1) - \tfrac{1}{3} \times E_1$$
$$-k_2 \times (1 - E_2) - \tfrac{1}{3} \times (1 - E_2) - \tfrac{1}{3} \times E_2$$
$$-k_3 \times (1 - E_3) - \tfrac{1}{3} \times (1 - E_3) - \tfrac{1}{3} \times E_3.$$

The transfer function T(s) of the entire circuit shown in FIG. 6 may then be written as:

$$T(s) = \frac{e_0}{e_i} = \frac{1 + k_1(1 - E_1) + k_2(1 - E_2) + k_3(1 - E_3)}{1 + D_1(1 - E_1) + D_2(1 - E_2) + D_3(1 - E_3)} \quad (6)$$

Figure 7:
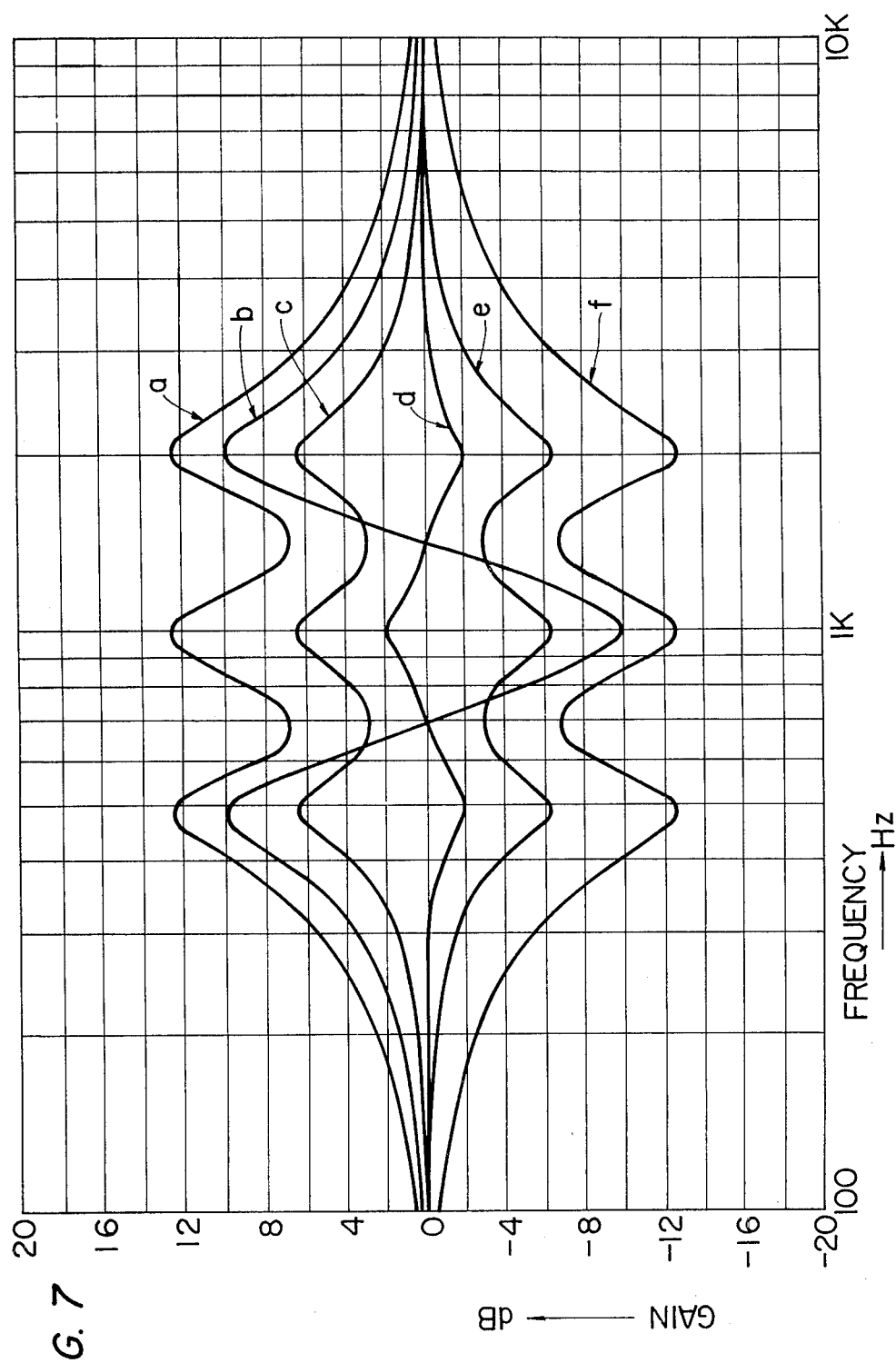
FIG. 7 is a graphical representation indicating various frequency characteristics of the device shown in FIG. 6.

FIG. 7 shows various frequency characteristics of the circuit arrangement shown in FIG. 6. In FIG. 7, the center frequency $f_1$ of the band-stop filter $13_1$ is 500 Hz, that of the band-stop filter $13_2$ is 1 KHz, and that of the band-stop filter $13_3$ is 2 KHz, with Q being 3 for each band-stop filter. The gains of curves a through f at the center frequencies of the filter $13_1$ through $13_3$ are as listed in the following Table 1:

TABLE 1

|   | 500 Hz     | 1 KHz      | KHz        |
|---|------------|------------|------------|
| a | 12 dB BOOST | 12 dB BOOST | 12 dB BOOST |
| b | 12 dB BOOST | 12 dB BOOST | 12 dB BOOST |
| c | 6 dB BOOST  | 6 dB BOOST  | 6 dB BOOST  |
| d | 2 dB CUT    | 2 dB BOOST  | 2 dB CUT    |
| e | 6 dB CUT    | 6 dB CUT    | 6 dB CUT    |
| f | 12 dB CUT   | 12 dB CUT   | 12 dB CUT   |

As is apparent from the above description, according to the invention, the center frequency, the sharpness Q and the gain in each channel can be varied independently. Thus, this embodiment of a tone control device according to the invention is also quite suitable as a graphic equalizer. No interference is caused between the channels with regard to frequency characteristics and therefore the tone control device is free from problems such as noise and an increased distortion factor.

This embodiment of the invention has been described with reference to an example in which three channels are employed. However, it is obvious that the technical concept of the invention is applicable to a tone control device having n channels, n being larger than three. In this case, the amplification factor of each of the amplifiers $14_{11}$, $14_{12}$, ... $14_{n1}$ and $14_{n2}$ is set to $1/n$.

Thus, the intended object has been sufficiently achieved by the provision of the tone control device according to the invention.

What is claimed is:

1. A tone control device comprising: a plurality of bandpass filter having different center frequencies from one another and having variable characteristics for tone control; a signal sum circuit for summing output signals of said bandpass filters and an input signal, an output signal from said sum circuit being coupled to inputs of said bandpass filters; and a signal sum and difference circuit, outputs of said bandpass filters being coupled to inverting input terminals of said sum and difference circuit and said output signals from said sum circuit being coupled to a non-inverting input terminal of said sum and difference circuit, an output signal from said sum and difference circuit forming the output signal of said device.

2. The tone control device of claim 1 wherein said output signals of said bandpass filters and said input signal are coupled to inverting input terminals of said sum circuit.

3. A tone control device comprising: characteristic circuits of n channels parallel-connected between input and output signal sum circuits provided on input and output sides of said device, respectively, each characteristic circuit comprising: a band-stop filter which receives as an input an output of said input sum circuit and has an output coupled to an input of said output sum circuit through a first amplifier, a second amplifier having an amplification factor 1/n which receives as an input a signal representing a difference between an output of said input signal sum circuit and an output of said band-stop filter with an output signal from said second amplifier being coupled to an input of said output signal sum circuit; a third amplifier which receives as an input said signal representing said difference with an output of said third amplifier being coupled to an input of said output signal summer and a fourth amplifier which receives as an input said signal representing said difference with an output of said fourth amplifier being coupled to an input of said input signal summer.

4. The tone control device of claim 1 wherein said inputs of said input and output sum circuits are inverting inputs.

* * * * *